United States Patent
Chang et al.

(10) Patent No.: US 7,906,377 B2
(45) Date of Patent: Mar. 15, 2011

(54) FABRICATION METHOD OF CIRCUIT BOARD

(75) Inventors: Wen-Yuan Chang, Taipei Hsien (TW); Wei-Cheng Chen, Taipei Hsien (TW); Yeh-Chi Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 12/432,367

(22) Filed: Apr. 29, 2009

(65) Prior Publication Data

US 2010/0155939 A1 Jun. 24, 2010

Related U.S. Application Data

(60) Provisional application No. 61/140,846, filed on Dec. 24, 2008.

(30) Foreign Application Priority Data

Apr. 3, 2009 (TW) ............................. 98111229 A

(51) Int. Cl.
*H01L 21/50* (2006.01)

(52) U.S. Cl. ................. 438/124; 438/613; 257/E23.038

(58) Field of Classification Search .................. 257/700, 257/774, 779, 780, 781, 784, E23.001, 737–738, 257/E21.476, E23.02, E23.068; 438/611–615, 438/117–118, 622, 637–638, 125, 106, 108, 438/111, 123, 124

See application file for complete search history.

(56) References Cited

U.S. PATENT DOCUMENTS 6,872,590 B2 * 3/2005 Lee et al. ...................... 438/106
2002/0190376 A1 12/2002 Sato

FOREIGN PATENT DOCUMENTS

CN 1620230 5/2005
CN 101252092 8/2008

* cited by examiner

*Primary Examiner* — Thao X Le
*Assistant Examiner* — Hoa B Trinh
(74) *Attorney, Agent, or Firm* — J.C. Patents

(57) ABSTRACT

A fabrication method of a circuit board is provided. A substrate, a top pad, a base pad electrically connecting the top pad, and a top and a base solder resist layers are provided. The top and the base pads are disposed on two opposite surfaces of the substrate, respectively. The top solder resist layer having a first opening partially exposing the top pad and the base solder resist layer having a second opening partially exposing the base pad are disposed on the two surfaces, respectively. A conductive layer covering the base solder resist layer and the base pad is formed. A plating resist layer having a third opening is formed on the conductive layer. A current is applied to the conductive layer through the third opening for electroplating a pre-bump on the top pad. The plating resist layer and the conductive layer are then removed.

5 Claims, 4 Drawing Sheets

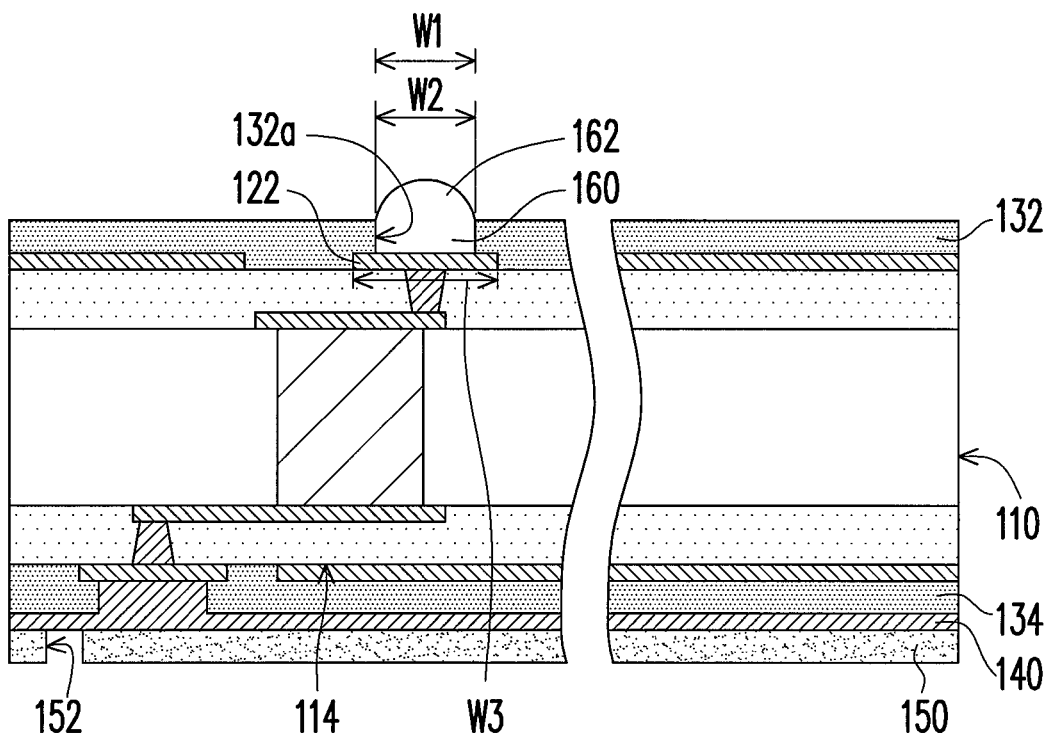
FIG. 1C'
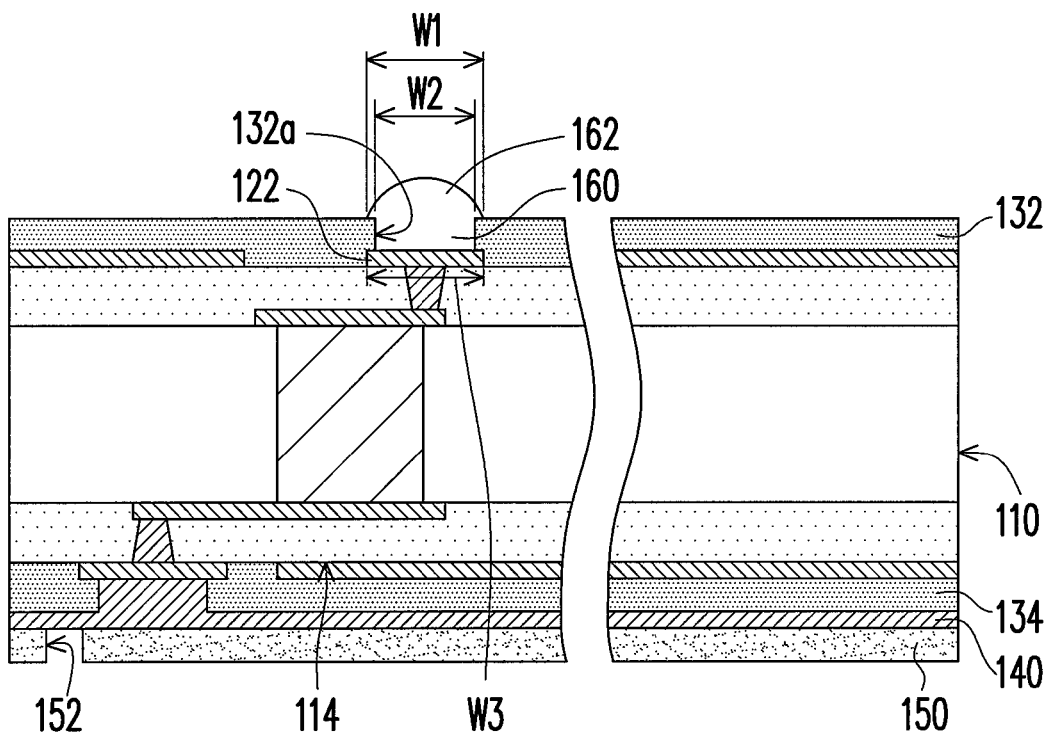
FIG. 1C"

FABRICATION METHOD OF CIRCUIT BOARD

CROSS-REFERENCE TO RELATED APPLICATION

This application claims the priority benefit of U.S. provisional application Ser. No. 61/140,846, filed on Dec. 24, 2008, all disclosures are incorporated therewith. This application also claims the priority of Taiwan application serial no. 98111229, filed on Apr. 3, 2009. The entirety of each of the above-mentioned patent applications is hereby incorporated by reference herein and made a part of this specification.

BACKGROUND OF THE INVENTION

1. Field of the Invention

The present application relates to a circuit board, a fabrication method thereof, and a chip package structure having the circuit board. More particularly, the present application relates to a circuit board in which bump pitches are relatively small, a fabrication method of the circuit board, and a chip package structure having the circuit board.

2. Description of Related Art

With the advance of integrated circuits, chip packaging technologies are diversified little by little. On account of advantages of miniaturized chip package size and shortened signal transmission path, a flip chip interconnect technology has been extensively applied to the field of chip packaging.

Nonetheless, in the flip chip interconnect process, solder bumps used for bonding a chip to a chip carrier are apt to be squeezed by the chip and collapsed, which results in reduction of manufacturing yield. Hence, a controlled collapse chip connection (C4) technology has been proposed by the related art to deal with the problem of bump collapse.

According to the C4 technology, protruding pre-bumps are formed on a chip carrier for connecting solder bumps of a chip. A method of forming the pre-bumps is described below. First, a seed layer is entirely formed on the chip carrier, and a patterned photoresist layer is formed on the seed layer. Here, the seed layer covers a solder resist layer and pads that are exposed by openings of the solder resist layer. Besides, the patterned photoresist layer has a plurality of openings respectively connecting the openings of the solder resist layer on the chip carrier. Note that the openings of the solder resist layer expose the pads. Next, by electroplating the seed layer, the openings of the solder resist layer and the openings of the patterned photoresist layer are filled with metal, so as to form the pre-bumps.

The aforesaid pre-bumps can support the solder bumps melted in the flip chip interconnect process, and therefore the conventional melted solder bumps squeezed by the chip can be prevented from being collapsed.

However, in the above-mentioned process of forming the pre-bumps, the openings of the patterned photoresist layer need to be connected to the openings of the solder resist layer, and the openings of the solder resist layer are completely exposed. Thus, the requirement for alignment accuracy poses a limitation on formation of the openings of the patterned photoresist layer. Thereby, a width of the openings of the patterned photoresist layer is greater than a width of the openings of the solder resist layer. As such, the width of the openings of the patterned photoresist layer cannot be reduced, and neither can dimensions and bump pitches of the pre-bumps and the solder bumps. Moreover, since the bump pitches are unlikely to be shortened, pitches among the chip pads on the chips cannot be correspondingly shortened.

SUMMARY OF THE INVENTION

The present application is directed to a fabrication method of a circuit board. By applying the fabrication method, pitches among pre-bumps on the circuit board can be shortened.

The present application is further directed to a circuit board having relatively small bump pitches.

The present application is further directed to a chip package structure in which contact density of a chip and a circuit board is relatively high.

In the present application, a fabrication method of a circuit board is provided below. First, a substrate, at least a top pad, at least a base pad electrically connected to the top pad, a top solder resist layer, and a base solder resist layer are provided. The top pad and the base pad are respectively disposed on a top surface and a base surface opposite thereto of the substrate. The top solder resist layer having a first opening partially exposing the top pad and the base solder resist layer having a second opening partially exposing the base pad are disposed on the top surface and the base surface, respectively. Next, a conductive layer is formed on the base surface. The conductive layer covers the base solder resist layer and the base pad and electrically connects the base pad. Thereafter, a plating resist layer is formed on the conductive layer. The plating resist layer includes a third opening partially exposing the conductive layer. A current is then applied to the conductive layer through the third opening for electroplating a pre-bump on the top pad. After that, the plating resist layer is removed. The conductive layer is then removed.

In the present application, a circuit board including a substrate, at least a top pad, a top solder resist layer, and a pre-bump is further provided. The substrate includes a top surface and a base surface opposite to each other. The top pad is disposed on the top surface. The top solder resist layer is disposed on the top surface and partially covers the top pad. Besides, the top solder resist layer has an opening partially exposing the top pad. The pre-bump is disposed on the top pad and located in the opening. Here, the pre-bump has a protrusion protruding from the top solder resist layer, and a maximum width of the protrusion is less than or equal to a width of the top pad.

In the present application, a chip package structure including a circuit board, a chip, and at least a solder bump is further provided. The circuit board includes a substrate, at least a top pad, a top solder resist layer, and a pre-bump. The substrate includes a top surface and a base surface opposite to each other. The top pad is disposed on the top surface. The top solder resist layer is disposed on the top surface and partially covers the top pad. Besides, the top solder resist layer has an opening partially exposing the top pad. The pre-bump is disposed on the top pad and located in the opening. Here, the pre-bump has a protrusion protruding from the top solder resist layer, and a maximum width of the protrusion is less than or equal to a width of the top pad. The chip is disposed on the circuit board, and at least a chip pad is disposed on the chip. Here, a location of the chip pad corresponds to a location of the pre-bump. The solder bump is disposed between the chip and the circuit board to connect the pre-bump and the chip pad.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
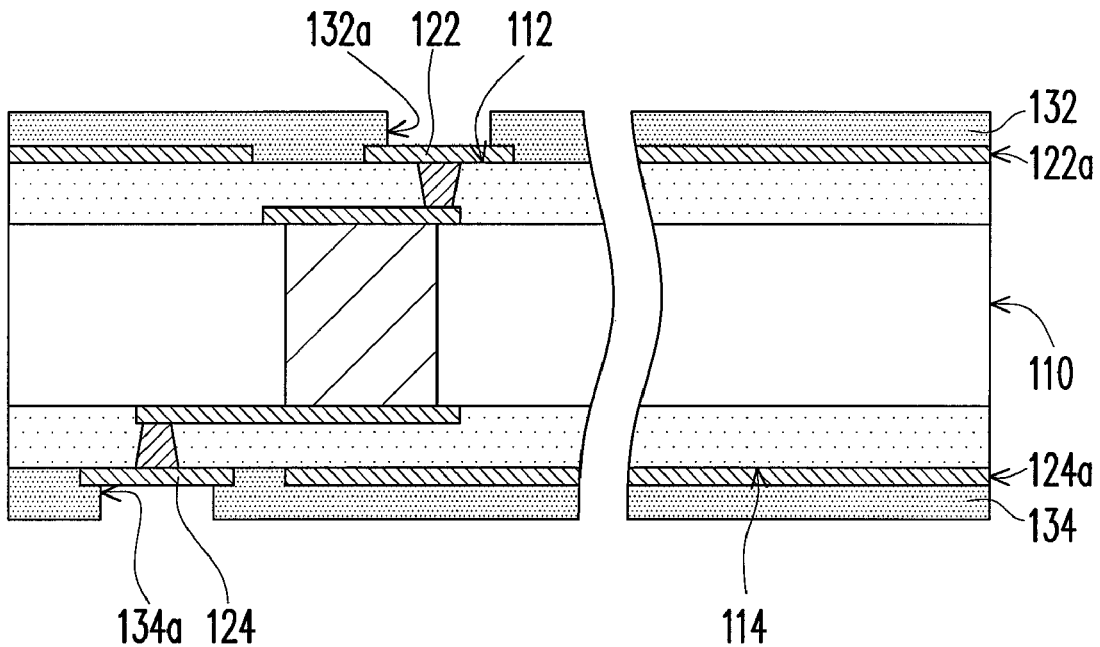
FIGS. 1A to 1D are cross-sectional views illustrating a fabrication process of a circuit board according to an embodiment of the present application.

FIGS. 1A to 1D are cross-sectional views illustrating a fabrication process of a circuit board according to an embodiment of the present application. First, referring to FIG. 1A, a substrate 110, a plurality of top pads 122, a plurality of base pads 124, a top solder resist layer 132, and a base solder resist layer 134 are provided. The top pads 122 and the base pads 124 are respectively disposed on a top surface 112 and a base surface 114 opposite thereto of the substrate 110. Besides, the top pads 122 and the base pads 124 are electrically connected. Note that only one of the top pads 122 and one of the base pads 124 are exemplarily illustrated in FIG. 1A to better illustrate the invention. In addition, to facilitate descriptions of the invention, the wordings "top" and "base" represent being located at opposite sides of the substrate instead of denoting substantial spatial limitation.

Specifically, in the present embodiment, a top circuit layer 122a and a base circuit layer 124a are respectively disposed on the top surface 112 and the base surface 114 of the substrate 110, and the top circuit layer 122a and the base circuit layer 124a are electrically connected. A portion of the top circuit layer 122a forms the top pad 122, and a portion of the base circuit layer 124a forms the base pad 124.

The top solder resist layer 132 and the base solder resist layer 134 are respectively disposed on the top surface 112 and the base surface 114. Moreover, the top solder resist layer 132 covers a portion of the top circuit layer 122a, and the base solder resist layer 134 covers a portion of the base circuit layer 124a. The top solder resist layer 132 has an opening 132a exposing a portion of the top pad 122. The base solder resist layer 134 has an opening 134a exposing a portion of the base pad 124.

Figure 1B:
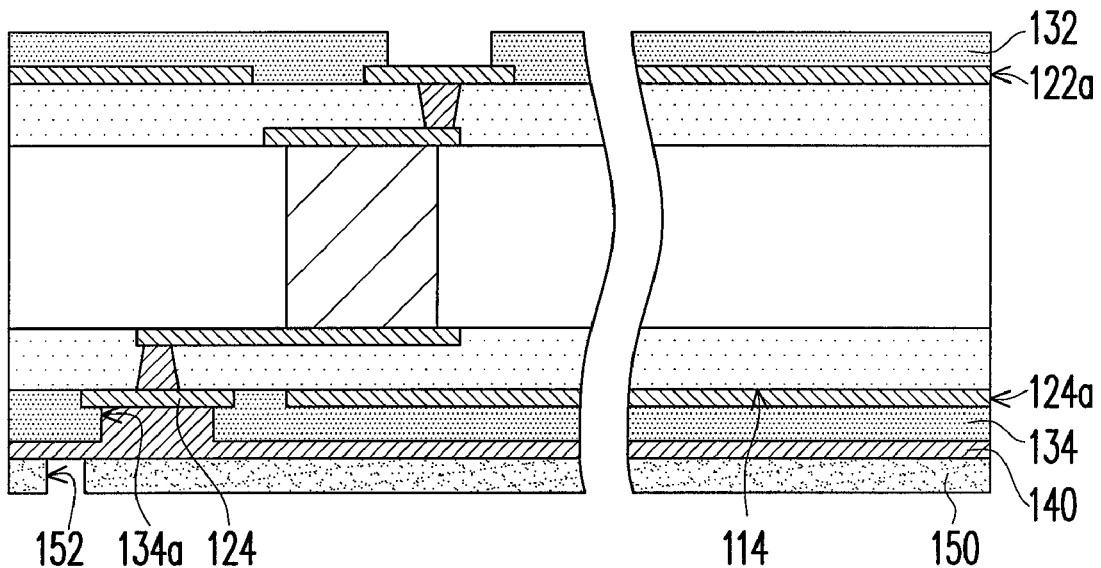

Next, referring to FIG. 1B, a conductive layer 140 is formed on the base surface 114 by electroless plating, for example. The conductive layer 140 covers the base solder resist layer 134 and the base pad 124 and electrically connects the base pad 124. Note that the conductive layer 140 can be electrically connected to a number of base pads 124 at the same time in the present embodiment.

Thereafter, referring to FIG. 1B, a plating resist layer 150 is formed on the conductive layer 140. The plating resist layer 150 has at least an opening 152 exposing a portion of the conductive layer 140. According to the present embodiment, the plating resist layer 150 is formed by first forming a photo-sensitive material layer (not shown) entirely on the conductive layer 140 and patterning the photo-sensitive material layer by performing an exposure and development process, for example.

Figure 1C:
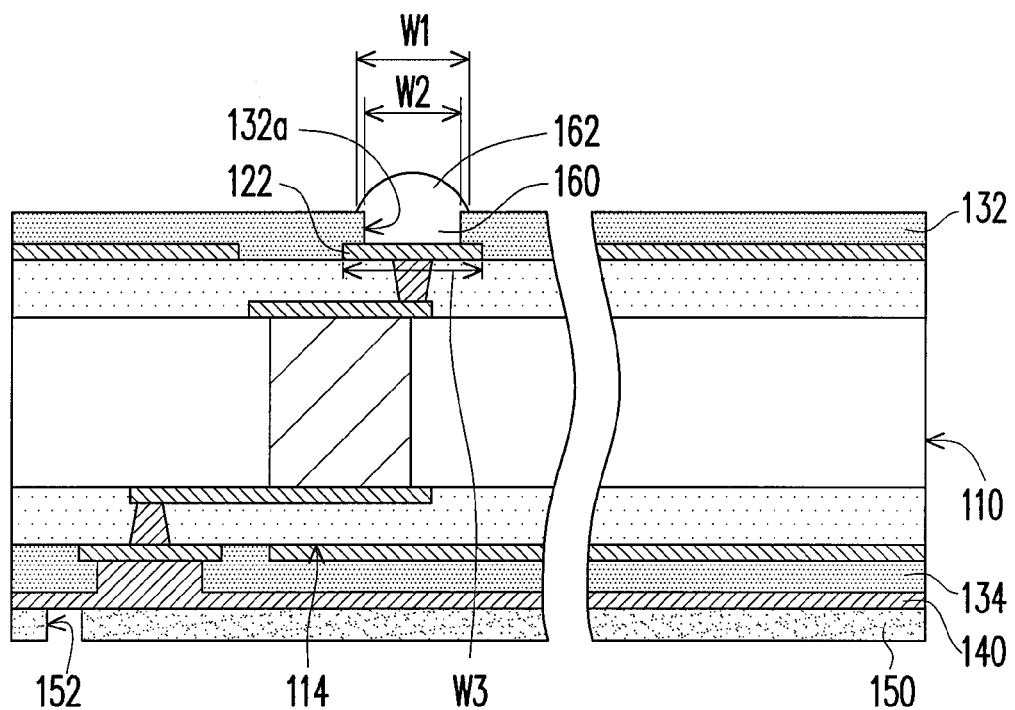

Referring to FIG. 1C, a current is then applied to the conductive layer 140 through the opening 152 for electroplating a pre-bump 160 on the top pad 122. In the present embodiment, the pre-bump 160 has a protrusion 162 protruding from the top solder resist layer 132. A maximum width W1 of the protrusion 162 is greater than a width W2 of the opening 132a. Furthermore, as shown in FIG. 1C', the maximum width W1 of the protrusion 162 may further be equal to the width W2 of the opening 132a. Namely, the maximum width W1 of the protrusion 162 is not less than the width W2 of the opening 132a. Additionally, the maximum width W1 of the protrusion 162 is less than a width W3 of the top pad 122. Furthermore, as shown in FIG. 1C", the maximum width W1 of the protrusion 162 may further be equal to the width W3 of the top pad 122. Namely, the maximum width W1 of the protrusion 162 is not greater than the width W3 of the top pad 122. FIG. 1C' further shows the structure with a maximum width W1 of the protrusion 162 being equal to a width W2 of the opening 132a.

It should be noted that the pre-bump 160 is formed through electroplating by applying the current to the conductive layer 140 located on the base surface 114 of the substrate 110 according to the present embodiment. Therefore, by applying the fabrication method of the circuit board in the present embodiment, the conventional limitation arisen from the requirement for alignment accuracy is no longer posed on formation of the openings of the patterned photoresist layer on the top surface of the chip carrier in the present application, and the issue with respect to incapability of narrowing the width of the openings of the patterned photoresist layer, reducing the dimensions of the pre-bumps, and shortening the pre-bump pitches can be resolved. To be more specific, in the present embodiment, no space should be reserved (e.g., by broadening the width of the openings of the patterned photoresist layer in the pertinent art) for achieving alignment. Accordingly, the maximum width W1 of the protrusion 162 of the pre-bump 160 is not greater than the width W3 of the top pad 122. On the contrary, subject to parameter settings required by ensuring alignment accuracy, the maximum width of the pre-bump is greater than the width of the top pad when the conventional alignment technology is conducted for forming the pre-bump. As a result, the fabrication method of the circuit board in the present embodiment can effectively reduce the dimension of the pre-bump 160 and shorten the bump pitch. Besides, the circuit board formed by applying the fabrication method of the present embodiment can carry the chip in which the pitches among the chip pads are relatively small.

Figure 1D:
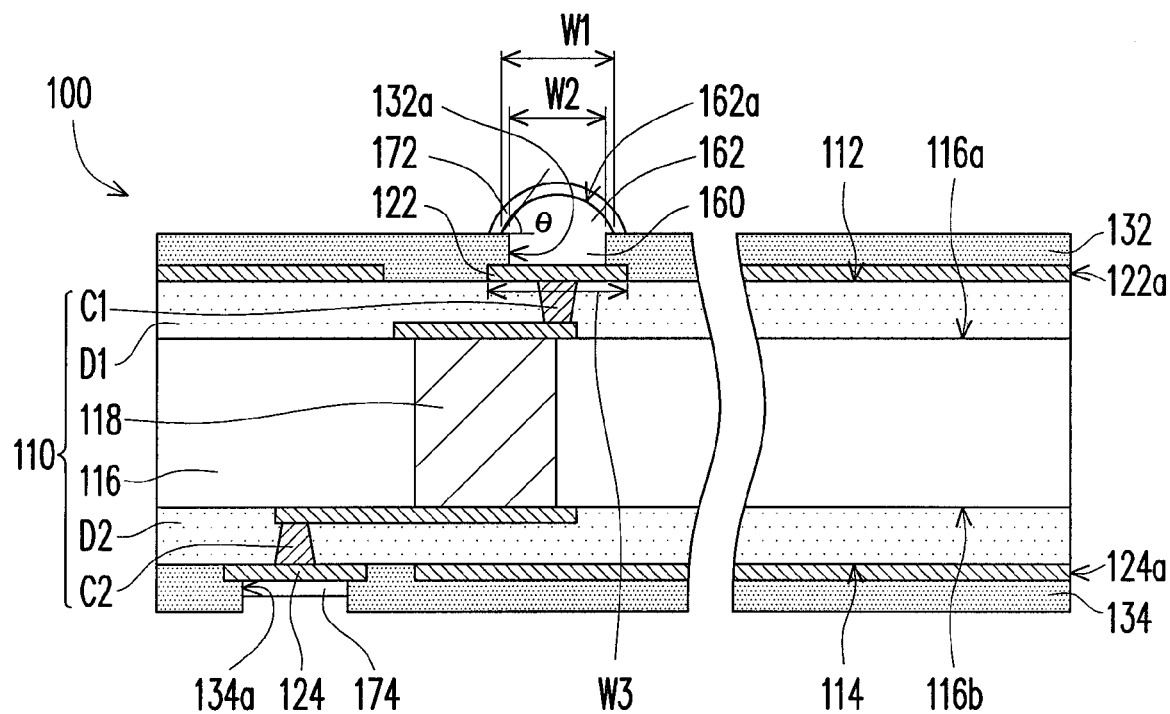

After that, referring to FIG. 1D, the plating resist layer 150 is removed, and the conductive layer 140 is then removed. So far, the circuit board 100 of the present embodiment is initially formed.

Next, referring to FIG. 1D, a surface treatment layer 172 can be formed on the pre-bump 160, and another surface treatment layer 174 can be formed on the portion of the base pad 124 exposed by the opening 134a according to the present embodiment. The surface treatment layers 172 and 174 are formed by, for example, performing an electroless nickel immersion gold (ENIG) process, an electroless nickel immersion palladium (ENIP) process, an electroless palladium immersion gold (EPIG) process, or an electroless nickel electroless palladium immersion gold (ENEPIG) process in the present embodiment.

The structure of the circuit board 100 depicted in FIG. 1D is elaborated hereinafter.

The circuit board 100 includes a substrate 110, a plurality of top pads 122, a top solder resist layer 132, a plurality of pre-bumps 160, a plurality of base pads 124, and a base solder resist layer 134. The substrate 110 has a top surface 112 and a base surface 114 opposite to each other. The top pads 122 are disposed on the top surface 112, and the base pads 124 are disposed on the base surface 114. Note that only one of the top pads 122 and one of the base pads 124 are illustrated in FIG. 1D to better illustrate the invention. In addition, to facilitate descriptions of the invention, the wordings "top" and "base" represent being located at opposite sides of the substrate instead of denoting substantial spatial limitation.

Particularly, in the present embodiment, the substrate 110 includes a core layer 116, a core conductive channel 118, an upper dielectric layer D1, an upper conductive channel C1, a bottom dielectric layer D2, and a bottom conductive channel C2.

The core layer 116 has an upper surface 116a and a bottom surface 116b opposite to each other. The core conductive channel 118 penetrates the core layer 116. The upper dielectric layer D1 is disposed on the upper surface 116a. The upper conductive channel C1 penetrates the upper dielectric layer D1 and electrically connects the core conductive channel 118 and the top pad 122. The bottom dielectric layer D2 is disposed on the bottom surface 116b. The bottom conductive channel C2 penetrates the bottom dielectric layer D2 and electrically connects the core conductive channel 118 and the base pad 124. It can be learned from the above that the top pad 122 can be electrically connected to the base pad 124 through the upper conductive channel C1, the core conductive channel 118, and the bottom conductive channel C2.

According to the present embodiment, the circuit board 100 includes a top circuit layer 122a disposed on the top surface 112, and a portion of the top circuit layer 122a forms the top pad 122. Further, the top circuit layer 122a does not have an electroplating line associated with formation of the pre-bump 160. Hence, when signals are transmitted within the circuit board 100, signal quality is not affected because no electroplating line associated with formation of the pre-bump is disposed. The top solder resist layer 132 is disposed on the top surface 112 and covers a portion of the top circuit layer 122a. Besides, the top solder resist layer 132 has an opening 132a exposing a portion of the top pad 122.

The pre-bump 160 is disposed on the top pad 122 and located in the opening 132a. Additionally, the pre-bump 160 has a protrusion 162 protruding from the top solder resist layer 132. A maximum width W1 of the protrusion 162 is greater than or equal to a width W2 of the opening 132a. Namely, the maximum width W1 of the protrusion 162 is not less than the width W2 of the opening 132a. Additionally, the maximum width W1 of the protrusion 162 is less than or equal to a width W3 of the top pad 122. Namely, the maximum width W1 of the protrusion 162 is not greater than the width W3 of the top pad 122.

In the present embodiment, the protrusion 162 has a convex cambered surface 162a facing a direction away from the top pad 122. A contact angle θ between the protrusion 162 and the top solder resist layer 132 is substantially less than 90 degrees. More particularly, the pre-bump 160 in the present embodiment is not formed by using the patterned photoresist layer as proposed in the related art, such that the protrusion 162 of the pre-bump 160 has the convex cambered surface 162a, and that the contact angle θ between the protrusion 162 and the top solder resist layer 132 is substantially less than 90 degrees. The pre-bump 160 can directly contact the top pad 122 and an inner wall of the opening 132a. Besides, the pre-bump 160 is a conductive bump and is made of metal, for example. In an embodiment, the pre-bump 160 is, for example, a copper bump. A material of the pre-bump 160 is, for example, a conductive material having a melting point greater than a melting point of a solder material (not shown), and the solder material is disposed on the pre-bump 160. Namely, the pre-bump 160 and the solder material have different melting points. According to the present embodiment, a surface treatment layer 172 can be disposed on the protrusion 162 to prevent the protrusion 162 from being oxidized or polluted by the external environment. A material of the surface treatment layer 172 includes nickel, gold, palladium, an alloy of a combination of nickel, gold, and palladium, or organic solderability preservative (OSP).

In the present embodiment, the circuit board 100 includes a base circuit layer 124a disposed on the base surface 114, and a portion of the base circuit layer 124a forms the base pad 124. Further, the base circuit layer 124a does not have an electroplating line associated with formation of the pre-bump 160. Hence, when signals are transmitted within the circuit board 100, because no electroplating line associated with formation of the pre-bump is disposed. The base solder resist layer 134 is disposed on the base surface 114 and covers a portion of the base circuit layer 124a. Besides, the base solder resist layer 134 has an opening 134a exposing a portion of the base pad 124. According to the present embodiment, a surface treatment layer 174 can be formed on the portion of the base pad 124 exposed by the opening 134a, so as to prevent the base pad 124 from being oxidized or polluted by the external environment. A material of the surface treatment layer 174 includes nickel, gold, palladium, an alloy of a combination of nickel, gold, and palladium, or OSP.

Figure 2:
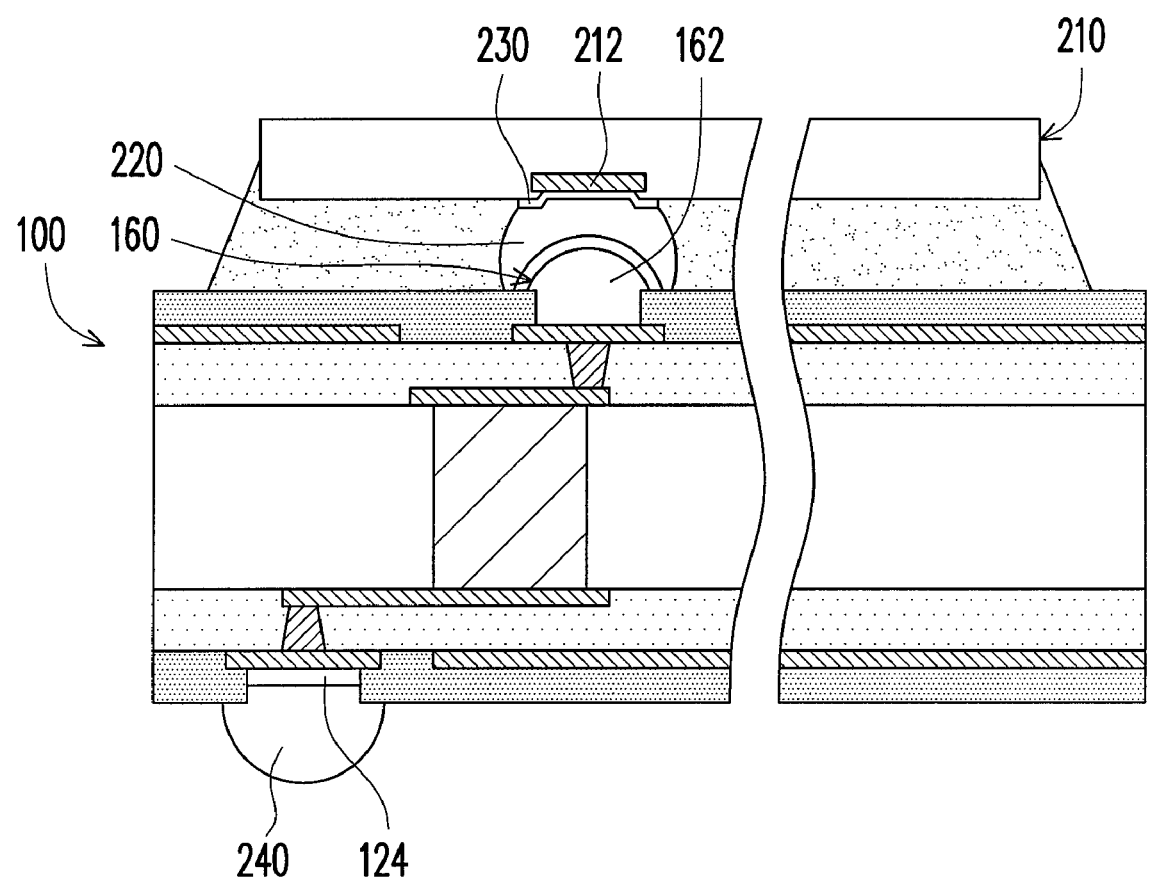
FIG. 2 is a cross-sectional view of a chip package structure according to an embodiment of the present application.

FIG. 2 is a cross-sectional view of a chip package structure according to an embodiment of the present application.

Referring to FIG. 2, the chip package structure includes a circuit board 100, a chip 210, and a plurality of solder bumps 220. Note that only one of the solder bumps 220 is depicted in FIG. 2 to better illustrate the invention. The structure of the circuit board 100 depicted in FIG. 2 is the same as the structure of the circuit board 100 depicted in FIG. 1D, and therefore no further description of the circuit board 100 is provided herein. The chip 210 is disposed on the circuit board 100, and a plurality of chip pads 212 are disposed on the chip 210. Here, locations of the chip pads 212 correspond to locations of the pre-bumps 160.

As shown in FIG. 2, the solder bump 220 is disposed between the chip 210 and the circuit board 100 to connect the pre-bump 160 and the chip pad 212. Additionally, the solder bump 220 and the pre-bump 160 can have different melting points. In the present embodiment, an under bump metallurgy (UBM) layer 230 can be disposed on the chip pad 212 as adhesion, diffusion barrier and electrical connection between the solder bump 220 and the chip pad 212. Moreover, the solder bump 220 can be disposed on the UBM layer 230 and encapsulate the protrusion 162 of the pre-bump 160. At least a solder ball 240 can be disposed on the base pad 124 in the present embodiment, so as to electrically connect other electronic elements (not shown).

In light of the foregoing, the conductive layer disposed on the base surface of the substrate is opposite to the pads disposed on the top surface, and the conductive layer serves as an electroplating seed layer in the present application, such that the pre-bumps are, by electroplating, formed on the pads disposed on the top surface of the substrate. Therefore, the conventional limitation arisen from the requirement for alignment accuracy is no longer posed on formation of the openings of the patterned photoresist layer on the top surface of the chip carrier in the present application, and the issue with respect to incapability of narrowing the width of the openings of the patterned photoresist layer, reducing the dimensions of the pre-bumps, and shortening the pre-bump pitches can be resolved. In other words, the decreased dimensions of the pre-bumps and the shortened bump pitches can be effectively achieved in the present application.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A fabrication method of a circuit board, comprising:
   providing a substrate, at least a top pad, at least a base pad, a top solder resist layer, and a base solder resist layer, the top pad and the base pad being respectively disposed on a top surface and a base surface of the substrate, the top surface being opposite to the base surface, the top pad and the base pad being electrically connected, the top solder resist layer and the base solder resist layer being respectively disposed on the top surface and the base surface, wherein the top solder resist layer has a first opening exposing a portion of the top pad, and the base solder resist layer has a second opening exposing a portion of the base pad;
   forming a conductive layer on the base surface, the conductive layer covering the base solder resist layer and the base pad and electrically connecting the base pad;
   forming a plating resist layer on the conductive layer, the plating resist layer comprising a third opening exposing a portion of the conductive layer;
   applying a current to the conductive layer through the third opening for electroplating a pre-bump on the top pad;
   removing the plating resist layer; and
   removing the conductive layer.

2. The fabrication method as claimed in claim 1, wherein the pre-bump has a protrusion protruding from the top solder resist layer, and a maximum width of the protrusion is greater than or equal to a width of the first opening.

3. The fabrication method as claimed in claim 1, wherein the pre-bump has a protrusion protruding from the top solder resist layer, and a maximum width of the protrusion is less than or equal to a width of the top pad.

4. The fabrication method as claimed in claim 1, further comprising:
   respectively forming a first surface treatment layer and a second surface treatment layer on the pre-bump and the portion of the base pad exposed by the second opening after the conductive layer is removed.

5. The fabrication method as claimed in claim 4, wherein a method of forming the first surface treatment layer or the second surface treatment layer comprises performing an electroless nickel immersion gold process, an electroless nickel immersion palladium process, an electroless palladium immersion gold process, or an electroless nickel electroless palladium immersion gold process.

* * * * *